(12) United States Patent
Strikovski et al.

(10) Patent No.: US 7,557,511 B2
(45) Date of Patent: Jul. 7, 2009

(54) APPARATUS AND METHOD UTILIZING HIGH POWER DENSITY ELECTRON BEAM FOR GENERATING PULSED STREAM OF ABLATION PLASMA

(75) Inventors: Mikhail Strikovski, Rockville, MD (US); Solomon H. Kolagani, Ellicott City, MD (US); Jeonggoo Kim, Laurel, MD (US)

(73) Assignee: Neocera, LLC, Beltsville, MD (US)

( * ) Notice: Subject to any disclaimer, the term of this patent is extended or adjusted under 35 U.S.C. 154(b) by 410 days.

(21) Appl. No.: 11/495,684

(22) Filed: Jul. 31, 2006

(65) Prior Publication Data
US 2007/0026160 A1   Feb. 1, 2007

Related U.S. Application Data

(60) Provisional application No. 60/703,880, filed on Aug. 1, 2005.

(51) Int. Cl.
*H05H 1/24* (2006.01)
*H01J 63/08* (2006.01)
*C08F 2/46* (2006.01)

(52) U.S. Cl. ............... 315/111.21; 313/231.31; 156/345.35; 250/492.2; 250/492.3; 427/533; 427/535

(58) Field of Classification Search ............ 315/111.21; 313/231.31; 156/345.35; 250/492.2, 492.3; 427/533, 535
See application file for complete search history.

(56) References Cited

U.S. PATENT DOCUMENTS

| | | | |
|---|---|---|---|
| 4,130,777 A * | 12/1978 | De Jule ............... | 345/74.1 |
| 5,576,593 A | 11/1996 | Schultheiss et al. | |
| 6,797,336 B2 * | 9/2004 | Garvey et al. ........... | 427/561 |
| 2005/0034668 A1 * | 2/2005 | Garvey et al. .......... | 118/723 R |

* cited by examiner

*Primary Examiner*—Nikita Wells
(74) *Attorney, Agent, or Firm*—Rosenberg, Klein & Lee (57) ABSTRACT

A pulsed electron ablation (PEA) utilizes a source of a high power density electron beam which includes a cathode plasma supplying electrons for generation of the electron beam and an anode plasma having a front layer extending in the processing chamber in a counter relationship with the front layer of the cathode plasma. A gas supply line is coupled to the processing chamber to supply a process gas in a controlled fashion to the anode to create a pressure gradient between the anode and the cathode plasma, and to stimulate an intense ionization of the process gas in the vicinity to the anode to form the anode plasma. The power density of the electron beam sharply increases as the result of an interaction of said cathode and anode plasmas at the double space charge contact layer formed between their fronts. A target is positioned in the processing chamber a predetermined distance from the front layer of the cathode plasma and is exposed to the electron beam to produce stream of the ablation plasma.

20 Claims, 11 Drawing Sheets

APPARATUS AND METHOD UTILIZING HIGH POWER DENSITY ELECTRON BEAM FOR GENERATING PULSED STREAM OF ABLATION PLASMA

The present Utility patent application is based on a Provisional Patent Application Ser. No. 60/703,880, filed 1 Aug. 2005.

FIELD OF THE INVENTION

This invention relates to the field of plasma generation, and specifically to generation of a pulsed stream of ablation plasma used for deposition of thin films on substrates.

More in particular, the present invention is directed to a pulsed electron ablation (PEA) technique in which a target is exposed to an electron beam, thereby causing ablation of material from the target to form a stream of ablation plasma for thin films deposition.

The present invention is further directed to a PEA apparatus and method which includes a source of electron beams having increased power (power density). The increased power of the electron beams is attained by creating a cathode plasma and a counter anode plasma interacting at a contact layer defined therebetween in a processing chamber, wherein the cathode and anode plasma interaction sharply increases the power of the electron beam generated by the cathode plasma.

BACKGROUND OF THE INVENTION

Fabrication of thin films has generally used a stream of chemical components directed towards a substrate for deposition thereon. The process takes place in a chamber filled with a process gas under a specific pressure or under vacuum conditions. The chemical components involved in the formation of the thin films may be in the form of atoms, ions, molecules, radicals, and/or other small size clusters of the material elements to be deposited on the surface.

Ablation is a technique employed to generate a stream of chemical components by exposing a limited volume of the target material to energy impact where the level exceeds the bonding energy of atoms in the material volume. This increases the temperature of the exposed volume to a level which exceeds the vaporization temperature of any element of the material volume. The material is converted into a dense, high temperature, and high-pressure cloud of plasma which is ejected from the surface of the target and forms a film deposition stream. The non-thermal equilibrium character of ablation provides for its distinguishing features, e.g., the ability even for multi-component materials to generate the stream of plasma with a composition close to that in the ablation volume.

A high power density ($\geqq 10^8 W/cm^2$) flux of energy is required to load the target volume with energy sufficient for material ablation. Usually, pulsed generator devices such as lasers or electron beam generators are used for this purpose. When a pulsed laser beam is used as the energy source for ablation, the film formation process is known as Pulsed Laser Deposition (PLD). When the pulsed power is the flux of energetic electrons used for ablation, then the plasma stream generation process is known as Pulsed Electron Ablation (PEA) and the film deposition technique is Pulsed Electron Deposition (PED). The use of fast electrons rather than eximer laser radiation (as in conventional laser ablation methods) enables ablation of materials that do not couple well to the laser due to either their partial transparency at the laser wavelength, or reflectivity considerations.

To enable PED for complex materials over a wide range, PEA apparatus is needed which has the capability of providing high power density flux of electrons. For example, for a target material with a large thermal conductivity, a higher flux density than for metal oxide target is required. Higher power density compensates for the energy losses from the ablation volume. Higher power density also results in a more energetic plasma stream that is advantageous for formation of some films. The source of the electron beam in PEA and PED processes is of great importance.

Figure 1:
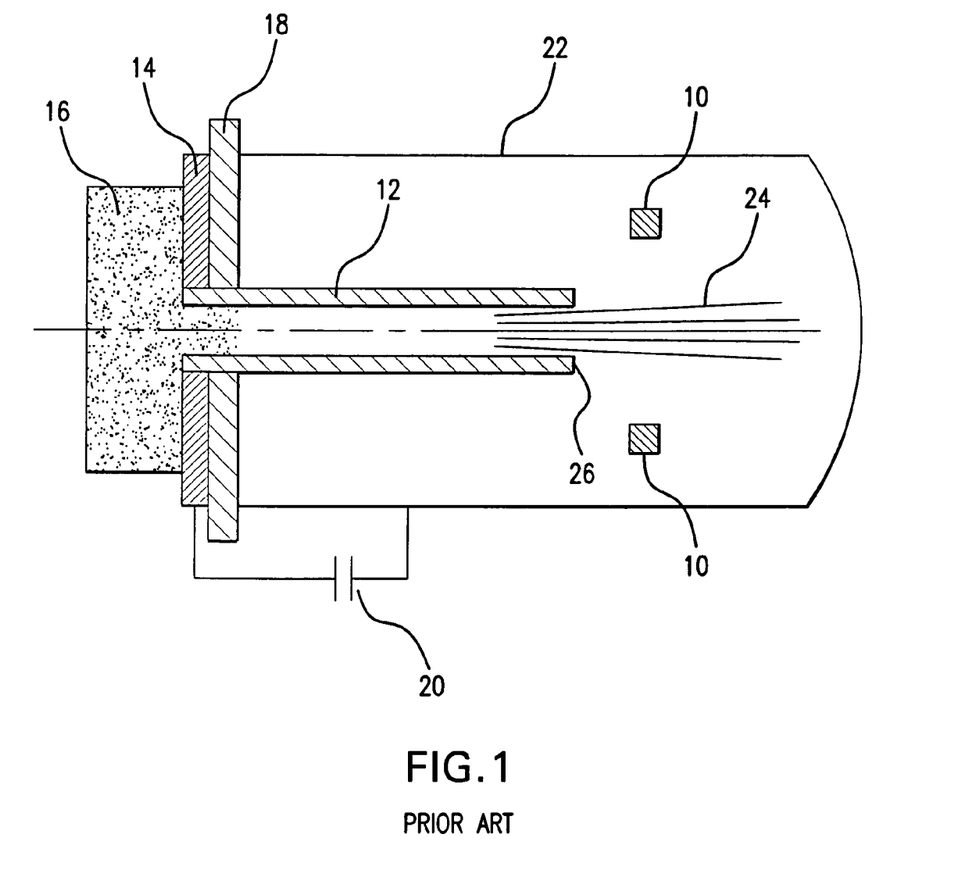
FIG. 1 is a schematic illustration of the electron beam source of the prior art.

An electron flux (beam) source based on what is commonly referred to as "channel-spark discharge" was introduced by C. Schultheiss in U.S. Pat. No. 5,576,593. The device, shown in FIG. 1, is a linear electron accelerator comprising a periodic structure of ring electrodes (auxiliary anodes) 10 separated by segments of dielectric tube 12. At one end, the tube 12 is connected to a metallic reservoir (cathode) wall 14 maintained at a negative potential in which a pulsed plasma 16 is created by a trigger (not shown). The plasma 16 serves as the source of electrons drawn into the tube 12 under the action of an electric field between the cathode 14 and the anode 10. Isolator 18 separates the cathode 14 and the anode 10. The role of the accelerator tube assembly is two-fold. First, it prevents the self-breakdown of the device that is spontaneous (without triggering) discharge of a capacitor 20. The second, it guides the flux of electrons (beam) emitted by the plasma 16 in the cathode reservoir 14 along the tube 12. Driven by the potential difference between the cathode plasma and the anode, the electrons reach an energy level of up to 10-20 keV as defined by the applied voltage between the cathode 14 and anode 10. At certain conditions, when gas pressure in the process chamber 22 is of an optimum level of ~0.2 Pa, it is possible to generate a well-collimated beam 24 directed by the tube 12, which emerges from its exit 26, and is able to propagate beyond the tube 12 due to the beam-induced space charge neutralization.

For the purpose of materials ablation, the electron beam power density, as well as the electron energy is of primary importance. Since the power density is proportional to the product of the beam current density and the source voltage, it is the electron current density that controls the beam power at a given operational voltage. However, since the boundary of the plasma is the source of the electron beam, the beam current and the power of the electron beams are limited in part by the ability of plasma in the plasma source to supply electrons to its boundary, e.g. are limited by the concentration of the plasma.

The device shown in FIG. 1 is thus somewhat deficient in its ability to deliver the electron beams of superior electron current density. An electron beam source capable of generating a high electron beam power density to be delivered to the surface of a target is needed to enable PEA and PED processes for a wide range of materials.

SUMMARY OF THE INVENTION

It is therefore an object of the present invention to provide a PEA apparatus that generates an electron beam of sufficiently high power density to enable the PED process for a wide range of materials.

It is another object of the present invention to optimize the configuration of the target assembly for a PEA process and to control properties of the stream of the ablation plasma to synthesize thin films on a substrate using the PED process.

It is still an object of the present invention to provide a generator of the ablation plasma which is controlled to provide compositional uniformity and cleanliness of the resulting ablation plasma stream impinging on a substrate for thin films deposition.

It is a further object of the present invention to provide generation of an ablation plasma plume having optimal plasma parameters, such as, for example, plasma density, potential distribution, geometrical configuration, etc.

The present invention is an apparatus which creates and uses a high power density electron beam for generating pulsed streams of ablation plasma.

The pulsed electron ablation (PEA) apparatus includes a processing chamber, a source of an electron beam and a target subjected to the electron beam to produce the plume of the ablation plasma emanating from the target for further deposition on a substrate. The source of the electron beam includes a first plasma having a first front layer extending into the processing chamber and supplying electrons for generation of the electron beam, and a second plasma having a second front layer extending in a counter relationship to the first front layer of the first plasma. A double space charge contact layer is defined between the first and second front layers of the first and second plasmas. The power of the electron beam is increased as the result of interaction between the first and second plasmas at the double contact layer.

A target is positioned in the processing chamber at a predetermined distance from the first front layer of the first plasma and is exposed to the electron beam in order that the ablation plasma emanates from the target when the electron beam impinges thereupon.

The PEA apparatus also includes an anode and a gas supply line coupled to the processing chamber to supply a process gas in a controlled fashion to the anode. A gas pressure gradient is thus created between the anode and the first plasma, and an intense ionization of the process gas is stimulated in the vicinity to the anode. A second plasma is formed as the result of the ionization of the process gas in the vicinity of the anode under impact by the electron beam generated by the first plasma. The peak power of the electron beam increases more than 35% during a transient period of time once the first and second plasmas make a contact at the double contact layer.

At a cathode side of the processing chamber, a reservoir-shaped cathode is positioned which has an internal cavity filled with a process gas. The cathode is initially at a negative potential with respect to the chamber walls and to the anode. The reservoir-shaped cathode is connected to a tube having a channel extending therealong in fluid communication at one end with the internal cavity of the reservoir-shaped cathode. An opposite end of the tube extends into the processing chamber.

The process gas fills the internal cavity of the reservoir-shaped cathode, the channel of the tube, and the processing chamber having a pressure preferably in the range of 0.2-0.5 Pa.

A discharge trigger is coupled to the reservoir-shaped cathode to initiate formation of initial plasma in the internal cavity. The initial plasma generates electrons which propagate along the channel and ionize the process gas, thereby forming the first plasma propagating along the channel towards an exit of the tube. The first front layer of said first plasma is formed in the vicinity of the tube exit where the electron beam is generated. The target or walls of the processing chamber, or the gas supply line may serve as the anode.

An auxiliary anode is arranged at the cathode side of the processing chamber in proximity to the reservoir-shaped cathode and is electrically separated therefrom, so that an electrical field applied between the reservoir-shaped cathode and the auxiliary anode facilitates in the propagation of the initial plasma from the internal cavity into the channel of the tube.

The tube may be positioned in angular relationship to an ablation surface of the target. To provide for uniform ablation, the target and the electron beam are displaceable relative each to the other in a controllable rotative or linear manner. A variety of target materials, as well as different shapes of the target may be used in the apparatus of the present invention.

The pressure of the process gas filling the internal cavity of the reservoir-shaped cathode, the channel of the tube, and the processing chamber is approximately in the range of 0.2-0.5 Pa, while the pressure of the process gas in the vicinity of the anode is approximately 200 times greater in order to create a strong pressure gradient between the anode and the cathode.

The present invention is also directed to a pulsed electron ablation (PEA) method for producing an ablation plasma emanating from a target subjected to a high power election beam which includes the following steps:

Generating a cathode plasma at a cathode member with the cathode plasma having a cathode plasma front layer, and emitting an electron beam from the front layer of the cathode plasma. Further the method includes supplying a process gas into the processing chamber in the vicinity of the anode member thereby creating a zone of an increased gas pressure and concentration. The electron beam is directed towards the anode member, thereby initiating ionization of the process gas in the vicinity of the anode member forming an anode plasma having an anode plasma front layer and increasing the power of the electron beam once the anode and cathode plasma front layers interact with each other at a double contact layer defined therebetween.

The electron beam having an increased power is directed to a target which forms a stream of ablation plasma emanating from the target to be used for thin film deposition on a substrate.

These and other features and advantages of the present invention will be made apparent from further description of the preferred embodiment in conjunction with the drawings.

DETAILED DESCRIPTION OF THE PREFERRED EMBODIMENT

An ablation plasma generator of the present invention, also referred to herein as a pulsed electron ablation (PEA) apparatus includes a mechanism for generating an electron beam impinging a target surface. This also includes a means for modifying and controlling the expanding plasma to provide elemental compositional uniformity and cleanliness of the resulting stream of species emanating from the target surface for depositing thin films on substrates. The ablation target in the apparatus of the present invention is an integral part of the generator. The ablation target is an active part of the electron beam source rather than just a passive recipient of the electron beam as it significantly affects the dynamics of the beam formation and its parameters.

Figure 2:
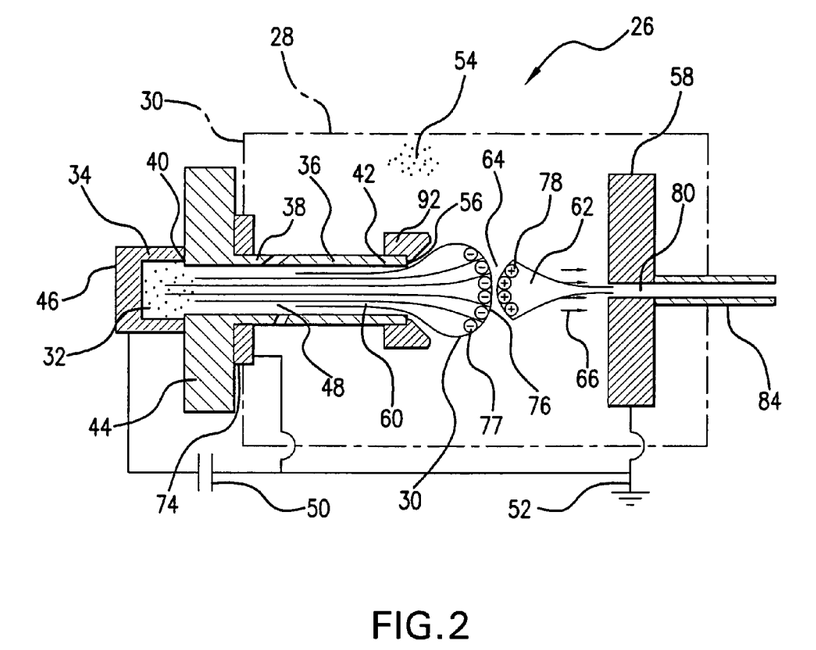
FIG. 2 is a schematic representation of the ablation plasma generator of the present invention explaining its operational principles.
Figure 3:
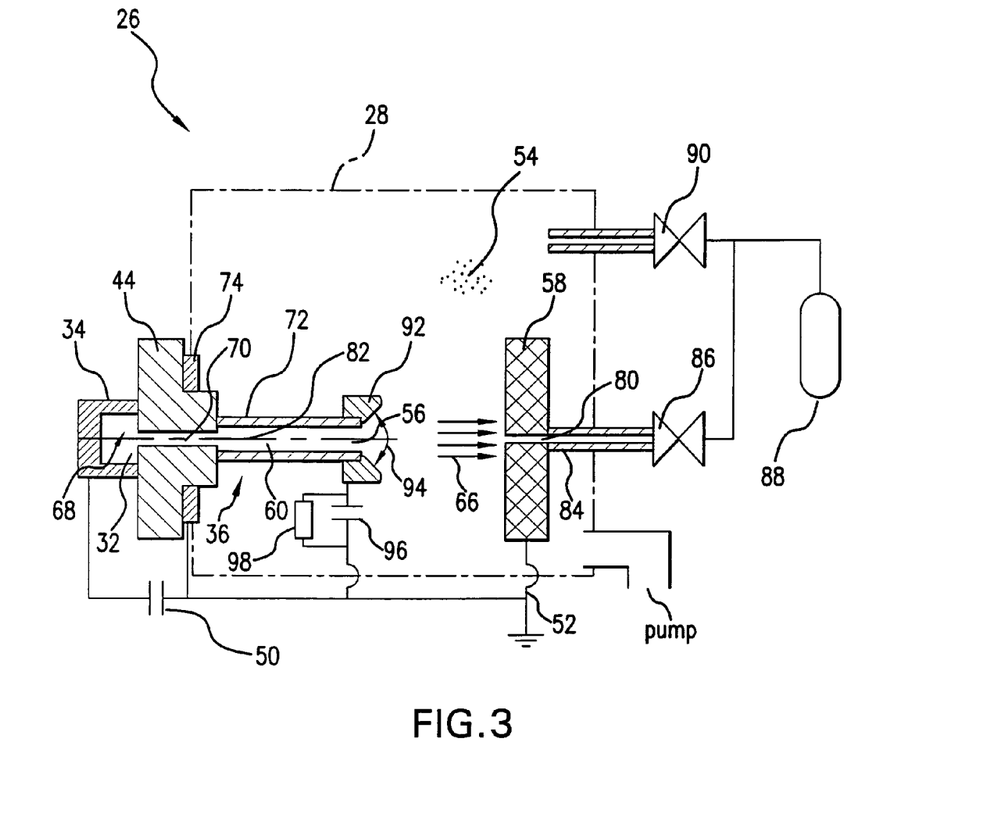
FIG. 3 is a schematic representation of another embodiment of the ablation plasma generator of the present invention.

Referring to FIGS. 2 and 3, the ablation plasma generator 26 includes a processing chamber 28, at one end 30 of which a pulsed, high-density plasma 32 is created in a reservoir-cathode 34 maintained initially at a negative potential. A dielectric tube 36 is connected by an end 38 to an opening formed in the reservoir wall 40. Another end 42 of the tube 36 extends freely into the processing (vacuum) chamber 28. A dielectric 44 electrically insulates the reservoir outer wall 46 from the volume of the grounded processing chamber 28, thus leaving the tube channel 48 to be the only path for current flow to discharge the capacitor 50 connected between the reservoir 34 and the ground 52. Optionally, a ring-shaped auxiliary grounded anode 74 may be used in the device. The common volume of the chamber 28, tube channel 48, and the reservoir 34 is filled with a process gas 54 at a predetermined pressure, for example, approximately in the range of 0.2-0.5 Pa.

As the dense plasma is triggered inside of the reservoir 34, the plasma serves as a source of electrons that are accelerated along the tube channel axis due to the potential difference which exists between the cathode 46 and the grounded electrodes. The tube 36 prevents losses of electrons in radial direction, provides for electrostatic focusing and to some degree aids in guiding the electrons therealong. The tube 36 serves initially as a geometrical restriction of a possible discharge cross section, thus preventing the discharge from self-triggering.

The plasma in the vicinity of the exit 56 of the tube 36 is the main source of the high current density electron beam. Internal surface of the tube 36 also serves as an effective source of secondary electrons formed under impact of the energetic electrons emitted by the cathode plasma. Due to the effective ionization of the gas in the tube 36 (ionization tube section 72 thereof), the cathode plasma expands along the tube and its front reaches the tube exit 56. At the exit, propagation of the ionization wave is slowed down, as no tube 36 is available beyond the exit 56 and the cathode plasma front experiences 3-dimensional loss of energetic electrons. The front of the cathode plasma in the vicinity of the tube exit is the main source of the beam of energetic electrons. In the generator 26 of the present invention, favorable conditions such as plasma density, potential distribution, and geometrical configuration of the cathode plasma and anode plasma are provided in the space between the exit 56 of the tube 36 and the target 58 for obtaining the electron beam with high power density. In turn, the beam facilitates in an intensive generation of the stream of the ablation material with the parameters which may be controlled and optimized in the space between the target 58 and a film deposition substrate.

Extensive experimentation has established that the power of the electron beam has its maximum level at the instant when two plasmas meet in the vicinity of the tube output 56. In the device shown in FIG. 2, two plasmas are created. Plasma (cathode) 60 propagates from the cathode side 30 of the chamber 28 along the tube 36, and carries potential close to that of cathode 34. Another plasma (anode) 62, carrying potential close to that of anode (i.e. ground) 52, propagates from the target 58 in an opposite direction towards the tube 36. As the two plasmas 60 and 62 contact, a conducting path is created therebetween that results in a sharp increase in the discharge current and voltage drop. However, during the short time of ~100 ns, transient conditions exist when high potential difference is still present within the thin contact layer 64 of high resistivity. The electrons supplied to the contact layer 64 by the cathode plasma side of the layer experience acceleration to the energy level corresponding up to nearly the entire voltage existing during the time at the cathode 34. These energetic electrons form the high power density electron beam impinging upon the target 58.

The dynamics of the process will be now presented in conjunction with the FIG. 3. As a trigger 68 creates the initial cathode plasma 32 inside the cathode reservoir 34, electrons are drawn therefrom into the channel 70 and then pass into an attached ionization tube 72 by an electric field, provided by an anode 74 isolated from cathode 34 by the isolator 44. The electrons ionize atoms of gas both in the internal volume of the channel 70 and the tube 72, as well as those absorbed at the inner surfaces thereof. If the ionization rate is sufficient, new plasma 60 connected to the initial plasma 32 (which is inside the cathode reservoir 34) is generated. In this way, the front of the plasma 60 propagates along the tube 72, i.e. a self-supporting plasma ionization wave is developing. As found experimentally, the wave carries nearly the entire cathode potential. The plasma column inside the tube 72 behind the ionization front is nearly electric field-free, and the potential at the front of the column is close to the cathode potential. The tube 72 supports the wave propagation since it provides gas atoms for surface ionization and also restricts losses of the plasma electrons.

Once the wave reaches the tube exit 56, the ionization rate drops due to a 3-dimensional escape of the tube plasma electrons and the lack of the surface ionization. Plasma propagation stops and spatially-stationary plasma front 76 forms. The plasma is dynamically supported by a weak current due to electron emission from the front. At a low gas pressure, generally lower than 0.1 Pa, this state of discharge with high negative potential existing at the tube exit 56, may last for an extended period of time which may last up to several microseconds before a breakdown, that is a sharp increase in the discharge current, occurs. At higher pressure, the delay time before breakdown decreases to lower than 10 ns. The breakdown between the tube exit plasma, which acts as a negative electrode, and an anode, which is any grounded electrode (for instance, chamber wall, target, gas supply line, etc.) develops via ionization of the space between them under the impact of electrons emitted by the tube plasma front 76. In the process, the counter plasma, e.g., a positively space charged anode plasma 62 is formed, which carries ground potential towards the tube exit as shown in FIG. 2. It is the properties of electrical double-layer of electrons 77 (from the tube side) and ions 78 (from the chamber side) at the contact surface 64 of the plasmas 60 and 62 that control the electron beam generation. The carriers concentration distribution of the plasmas and shape of their contact surface are important parameters. These issues are addressed by the device of the present invention as will be presented in following paragraphs.

In the embodiment of the ablation plasma generator shown in FIG. 3, the target 58 is placed at a distance of 7 to 15 mm from the tube exit 56 with the target having a wide variety of possible contours. For example, the target 58 may have a hole 80 of 0.5-1 mm diameter located in the vicinity of the axis line 82 of the tube 72. The process gas 54 is delivered to the hole 80 by a gas supply line 84 with a flow rate controlled by a valve 86 connected to a gas tank 88. The gas line 84 permits the establishing of a gradient of gas concentration between the hole 80 (higher value) and the tube exit 56 (lower value). The function of the hole 80 is to indicate and stabilize the location for the anode plasma origin wherein the pressure gradient provides for an increased ionization rate as well as the increased concentration of the electrons in the anode plasma 62. Once the ionization tube plasma 60 reaches the tube exit 56 it triggers a well-defined anode plasma counterpart 62 originating in a direction from the gas feed 84 towards the tube 72. The shape of the anode plasma 62, and generated beam 66 direction are stabilized in this manner. The beam 66 is not necessarily directed exactly to the gas line hole 80 since it is controlled by shape of the double layer 64.

The anode plasma 62 is formed due to ionization of the gas in the vicinity of the anode under impact of fast electrons emitted from the cathode plasma 60. Formation of the anode plasma is triggered by the cathode plasma. Once the trigger initiates the cathode plasma energetic electrons are emitted (accelerated by the electric field existing between the cathode 34 and the anode 74) which impact (ionize) the gas. When increased concentration of the gas is provided from the anode side the most intense ionization is stimulated at the anode side. In the case when the energetic electrons (propagating along the tube channel axis) cannot directly strike the anode (the case with a target formed of an isolator), the electrons can still form the "anode plasma" via ionizing gas atoms absorbed on the surface of the target. This results in "anode plasma" as this surface plasma is dense and becomes linked to the anode grounded electrode.

The gas pressure gradient increases the intensity of the electron beam 66. The anode plasma (facilitated by the local gas supply) provides more effective extraction of the electrons from the cathode plasma. Creation of the anode side plasma is equivalent to moving the anode closer to the cathode plasma. The "plasma anode" effectively decreases the gap between the ground and "plasma cathode", thus increases the extracted electron beam current.

There are two components that improve the beam current density due to local (from the anode side) supply of gas. The gas supply increases the concentration of the gas (and responsively plasma density on cathode side at the tube exit); and the gas supply facilitates presence of the dense anode side plasma thus enhancing extraction of the electrons from the cathode plasma.

At a given voltage, the electron beam current density J[A/cm$^2$] generated by a double layer 64 depends on the thickness of the layer D: $J \sim 1/D^2$. The total thickness is combined by the thicknesses of the cathode and anode sides of the double layer, $D=D_c+D_a$. The densities of the corresponding plasmas, $N_c$ and $N_a$, control the $D_c$ and $D_a$ values via relationship $D \sim 1/N$. Thus, without a pressure gradient, the generated beam density is limited by the concentration of anode side plasma $N_a$, since it is smaller than $N_c$ (and accordingly $D_a$ is larger than $D_c$). Once the increased gas pressure is provided at the anode side, the ionization rate increases, which leads to a smaller thickness of the double layer 64, and to a larger current density of the beam 66. High volume ionization rates at the target side is provided in the PEA apparatus of the present invention, since the free electron path is smaller than 1 mm at pressures greater than 4 Pa. A separate valve 90 controls independent gas flow into the chamber 28, and permits optimization of the gas pressure gradient and responsively the total chamber values.

Having a strong pressure gradient is an important parameter of the present invention. The pressure of the gas in the reservoir 34, tube 36 and at the tube end 56 is approximately in the range of 0.2-0.5 Pa. Regarding the local (near the gas supply tube at the target) process pressure such cannot quantitatively be measured since there is a large pressure gradient. However, it can be estimated from the known value of the process gas flow rate, and estimated flow coefficient Cv of the gas supply tube. Based on the technical data on orifice flow coefficients from Swagelok Company, a flow coefficient of Cv=0.016 may be obtained for a tube with 1.6 mm inner diameter A. The experimental gas flow rate is ~10 sccm (or $10^{-2}$ sL/m, standard Liter per Minute). From the same data, a pressure of ~85 Pa is needed to provide this flow via the Cv=0.016 tube. This is approximately a factor of 200 times higher than the chamber pressure of ~0.2-0.5 Pa.

The gas pressure profile can be estimated as it changes with a distance from the tube exit 56. Assuming that the characteristic length of gas pressure decrease is approximately the tube internal diameter A=1.6 mm (with exponential exp(−x/A) or with $1/(x/(A^3)$ type decay laws), the pressure drops ~100-1000 times at distance x of 10-16 mm from the tube exit. Thus the gas pressure inside of the hollow cathode 34 and inside of the channel 48 of the device will only be affected slightly by the local gas supply.

An auxiliary electrode 92 at the ionization tube exit 56 is used to improve azimuth uniformity of the cathode plasma 60 as well as to decrease the beam 66 divergence. As the cathode ionization wave arrives at the tube exit 56, the electrode 92 is charged to the plasma potential. Thus, the electrode shape or contour affects the electric field distribution at the tube exit 56 and the double layer 64 shape. The optimal angle 94 of the electrode opening is about 45 degrees with all sharp edges being removed. The electrode 92 increases the total beam current ~30% at distance of >10 mm. The electrode is loaded with a capacitor 96 of 10-100 pF, which increases the beam intensity. The capacitor may be shunted with a discharge resistor 98.

Internal diameters of the different sections of the dielectric tube 36, e.g. of the channel 70 and of the ionization tube 72 may be different since the two sections serve different purposes. The role of the channel 70 is to prevent self-discharge of the device at the operational conditions of pressure up to ~2 Pa and voltages of up to ~20 kV. These conditions are provided by restricting the channel 70 diameter to less than ~4 mm, and by minimizing the channel wall surface ionization. An embodiment with a smaller internal diameter insert 100 is shown for the channel section in FIG. 4A. The channel material with low out-gassing and with small secondary electron emission coefficient like Macor© ceramic may be used.

Figure 4A:
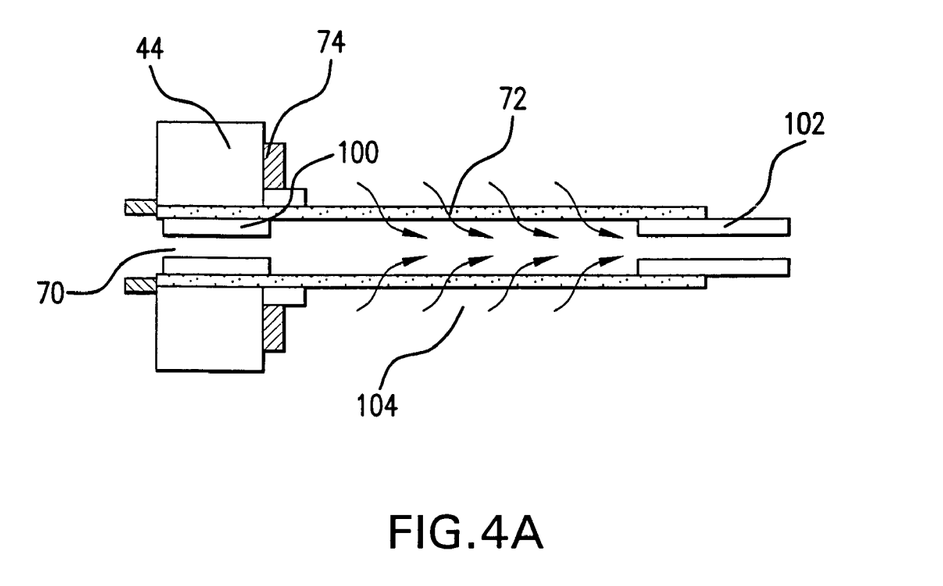
FIG. 4A illustrates schematically a cathode plasma propagation channel with variable channel diameter and gas-permeable tube walls.

The ionization tube section 72 provides for optimized propagation of the ionization wave especially for long-range propagation. This is promoted when larger tube diameters of up to ~8-10 mm are used for the section. Closer to the tube exit 56 the tube diameter may be reduced by inserting a ~30-40 mm long end piece 102. The smaller diameter end piece concentrates the cathode plasma, and also reduces the obstruction to the stream of target plasma. Material composition and properties of the ionization tube promote ionization. Ionization is promoted through the use of a material with a high secondary electron ionization coefficient such as Aluminum Oxide ($Al_2O_3$). A tube material composition with an open porosity is generally advantageous. The porosity allows for gas penetration thru the tube wall 104 while maintaining an optimized gas pressure stability in the tube. This type of tube further increases the effective internal surface area of the tube 72 and related ionization rate of the absorbed gases.

Figure 4B:
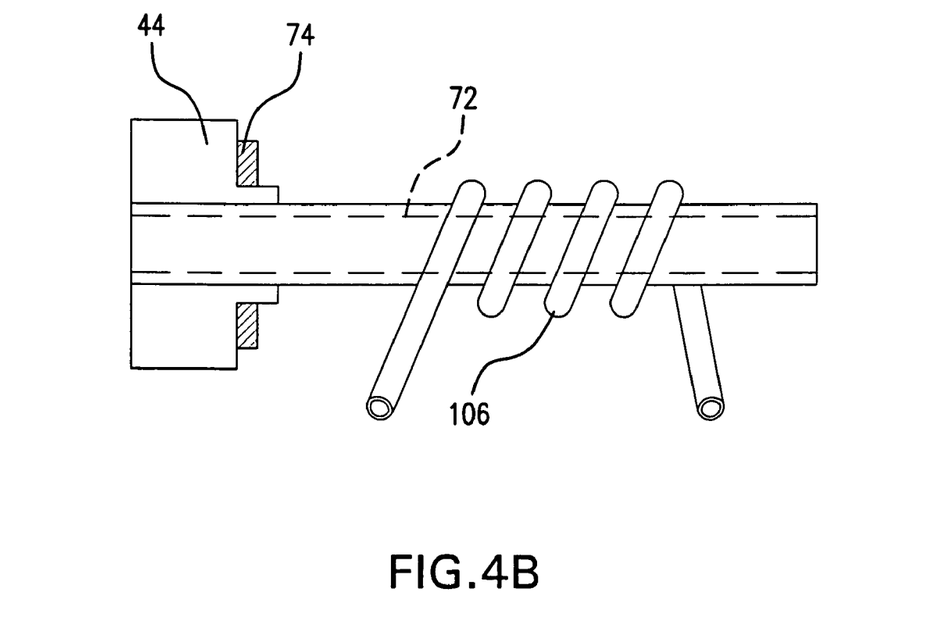
FIG. 4B is a schematic representation of the plasma propagation channel with a cooling device.

Temperature of the tube 72 strongly affects the ionization wave propagation. The temperature can rise either after extended operation of the beam source, via self-heating, or in case an external heater is located near the source. Increased temperature decreases surface concentration of the absorbed gases, and thus responsively the ionization rate. A water-cooling assembly 106, shown in FIG. 4B provides for tube temperature stabilization and control. The assembly 106 includes a coil formed of metal tubing with cooling water flowing therethrough. The coil is in radiative heat exchange with the ionization tube 72, and keeps the tube temperature from rising. To avoid direct discharge between the cathode plasma and the grounded coil, the coil terminates 20-30 mm from the tube exit 56. The assembly increases stability of the electron beam operation for extended times.

Figure 5A:
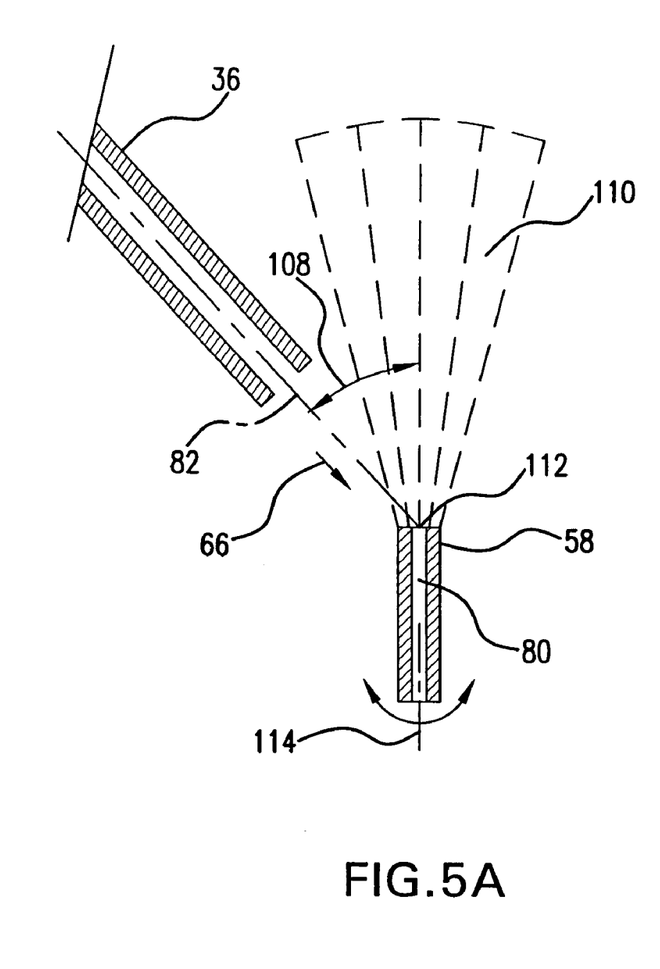
FIG. 5A illustrates schematically an on-axis angularly displaced electron beam-target assembly of the present intention with an integrated gas supply line.
Figure 5B:
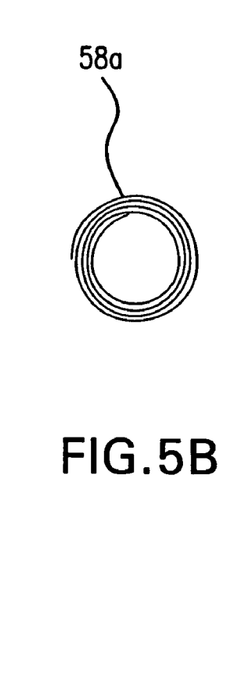
FIG. 5B is a schematic view of the target formed of rolled foil.

Another embodiment of a practical target assembly is shown in FIGS. 5A and 5B. To permit the ablation plasma to expand freely, the target surface is inclined at an angle 108 of 30-60 degree with respect to the tube 36. The tube axis 82 points to the gas line hole 80. The generated electron beam 66 creates the ablation stream 110 originating from an ablation area 112. Due to the inclination, material ablation is not uniform around the hole 80. To stabilize the ablation conditions, and to provide more target material for removal, the target 58 is rotated around the axis 114 of the hole's channel. This technique permits uniform material removal and the increased total area available for ablation. When the ablation area 112 covers the entire cross section of the target 58, the target must be renewed. To renew the material under ablation at the same position, the target tube 58 may be moved forwardly. To fabricate the target of this kind from a material (metal) that is not available in tubular form, an alternative arrangement of the target 58a is seen in FIG. 5B. The target 58a is made from a rolling foil of material to form the similar tubular shape. Metallic foils of many metals are readily available having a thickness of 15-30 micrometers.

Figure 6A:
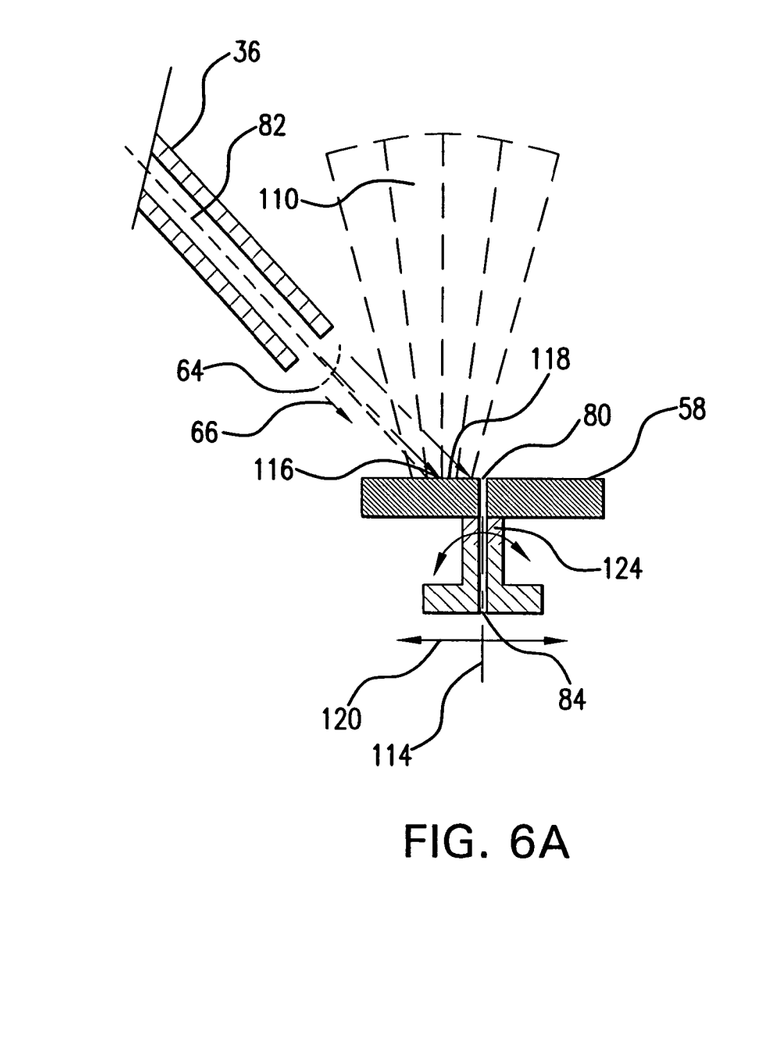
FIG. 6A is a schematic representation of an off-axis angularly displaced electron beam-target assembly of the presents invention with an integrated gas supply line.

In another arrangement of the present invention shown in FIG. 6A, the hole 80 is offset from projection point 116 of the tube axis 82 onto the target surface 58. As the double layer 64 is inclined, the beam 66 deviates from the point 116 somewhat towards the hole 80 and ablates target 58 in the area 118. Rotation of the target around the axis 114 facilitates a circular ablation track. The gas delivery line 84 is decoupled from the target 58 which enables the rotation. Linear shifting of the target assembly along the line 120 changes the offset value between the points 116 and 80 within predetermined limits during ablation. With programmable and controllable offset in combination with the target rotation, a uniform target surface wear is attained.

Figure 6B:
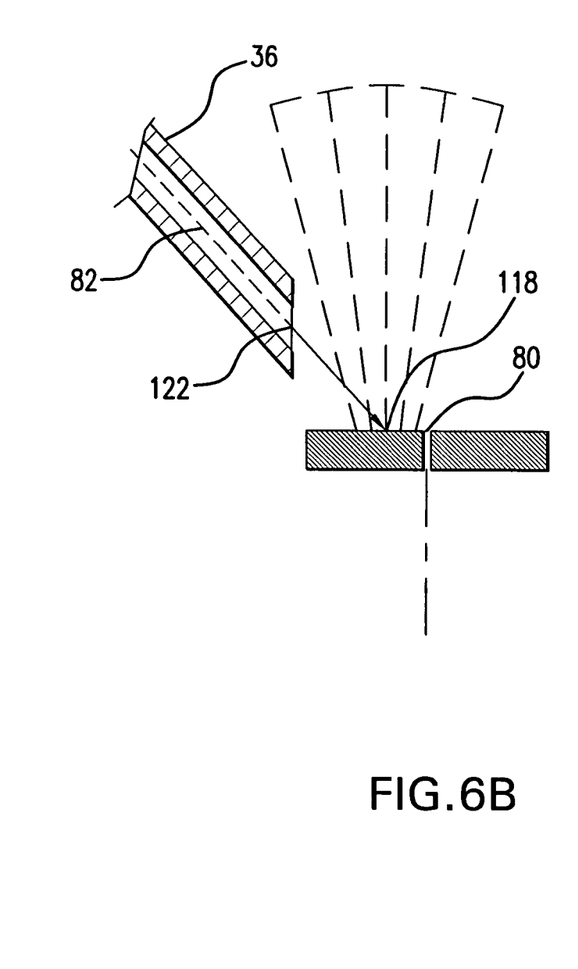
FIG. 6B is an off-axis angularly displaced electron beam-target assembly of FIG. 6A having a modified tube.

To reduce interference of the ablation stream 110 with the tube 36, especially at small tube to target distances, the tube end 122 is cut at an angle as shown in FIG. 6B. A 45-degree angle is convenient. However, if the distance permits, it is generally preferable to avoid cutting since this affects symmetry of the double layer 64 emitting the beam 66.

When the target 58 is formed of conducting or semi-conducting materials, it directly serves as the anode connected to ground via the gas supply line 84. In case of insulating materials, the use of a thinner target is preferable when mounted on a conducting platform 124 as shown in FIG. 6A.

Figures 7A, 7B, 7C:
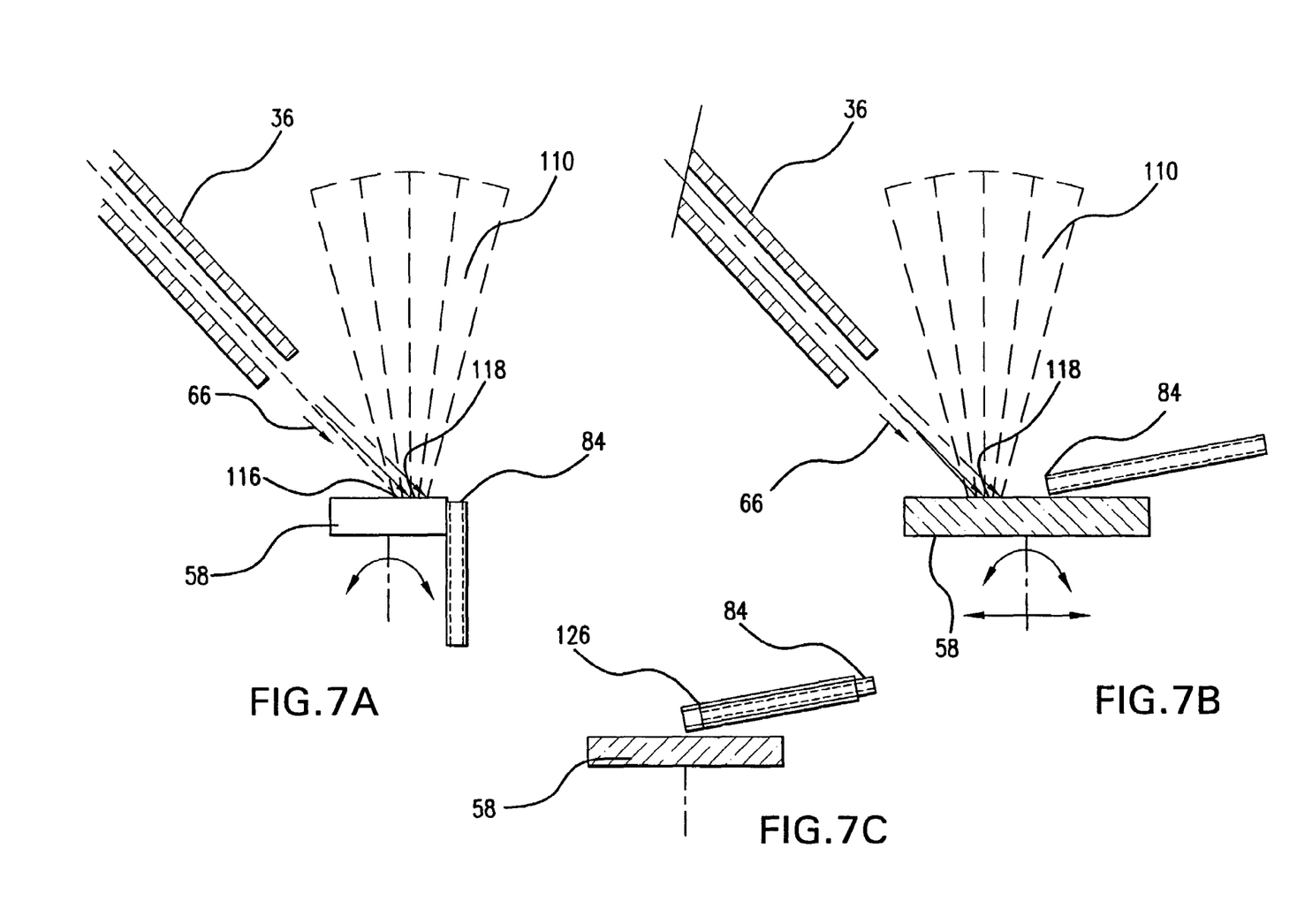
FIG. 7A is a schematic representation of the apparatus of the present invention with an independent gas supply line.
FIG. 7B is a schematic representation of the apparatus of the present invention with a multi-dimensional target displacement relative to the electron beam.
FIG. 7C is a schematic representation of the ablation assembly with the gas supply line protected from contaminating the stream of the ablation plasma.

If the target with a hole 80 is not feasible, a target assembly configurations shown in FIGS. 7A-7C may be used. In FIG. 7A, the gas supply line 84 is stationary and is mechanically decoupled from the target 58. This enables scanning the target (by rotation, translation, or combination of both) for uniformly ablating the target area. The gas supply line 84 terminates at ~10 mm distance from the projection point 116 leaving the area of target for ablation. The line 84 can be oriented either in the plane of the drawing or in a perpendicular plane.

FIG. 7B shows another embodiment of the gas supply line 84 located at the same side of target 58 as the electron beam tube 36. In this arrangement, the target movement in its surface plane is not limited and uniform ablation of the target area may be attained with appropriate target scanning.

To minimize the possibility of contamination of the ablation stream with material of the gas tube line, the tube 84 can be placed inside an external protective tube 126 formed of an acceptable material as shown in FIG. 7C. The tip of the tube 126 extends few millimeters beyond the tip of the internal conducting gas supply tube 84 to prevent the ablation stream from interfering with the tube 84.

Decoupling of the target 58 and the gas line 84 permits a degree of steering of the electron beam 66 by changing the position of the gas output relative to the tube projection point 116. It has been found that the beam direction tends to incline towards the anode gas source. Thus, moving the gas line 84 permits some steering the beam 66.

To minimize possible contamination from the gas supply tube 84, the tube 36 is preferably formed of the same material as the target or at least some element of the target. For example, for ablating Y—$Ba_2$—$Cu_3$—$O_7$ or $Al_2O_3$ targets, a Cu or Al gas tube may be chosen accordingly.

Figure 8A:
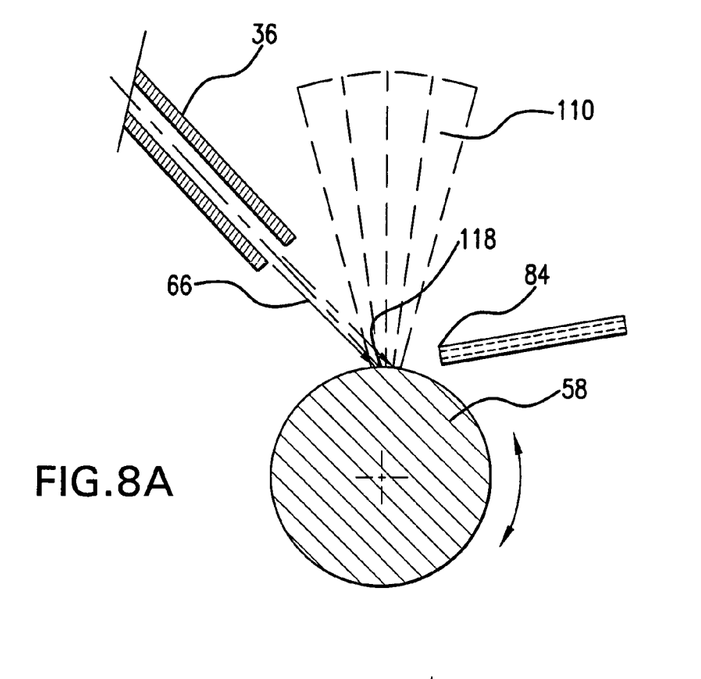
FIG. 8A is a schematic representation of an alternative target ablation assembly of the present invention.
Figure 8B:
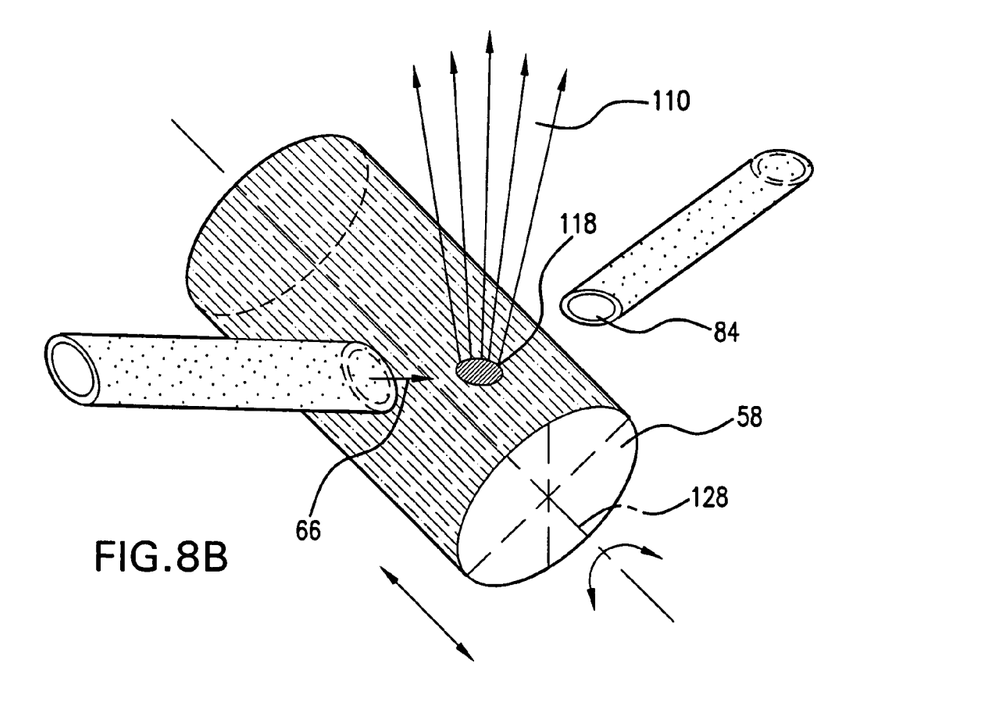
FIG. 8B is a perspective view of FIG. 8A.

Another embodiment of target surface scanning is shown in FIGS. 8A and 8B. The target 58 is shaped as a solid cylinder oriented perpendicular to the electron beam 66. The cylinder 58 rotates around its axis 128, and shifts back and forth along the axis. In this arrangement, the entire surface of the cylinder 58 may be ablated uniformly. By adjusting the location of the ablation area 118 on the target surface relative the cylinder axis 128 directions of the plume 110 can be varied.

Figure 9:
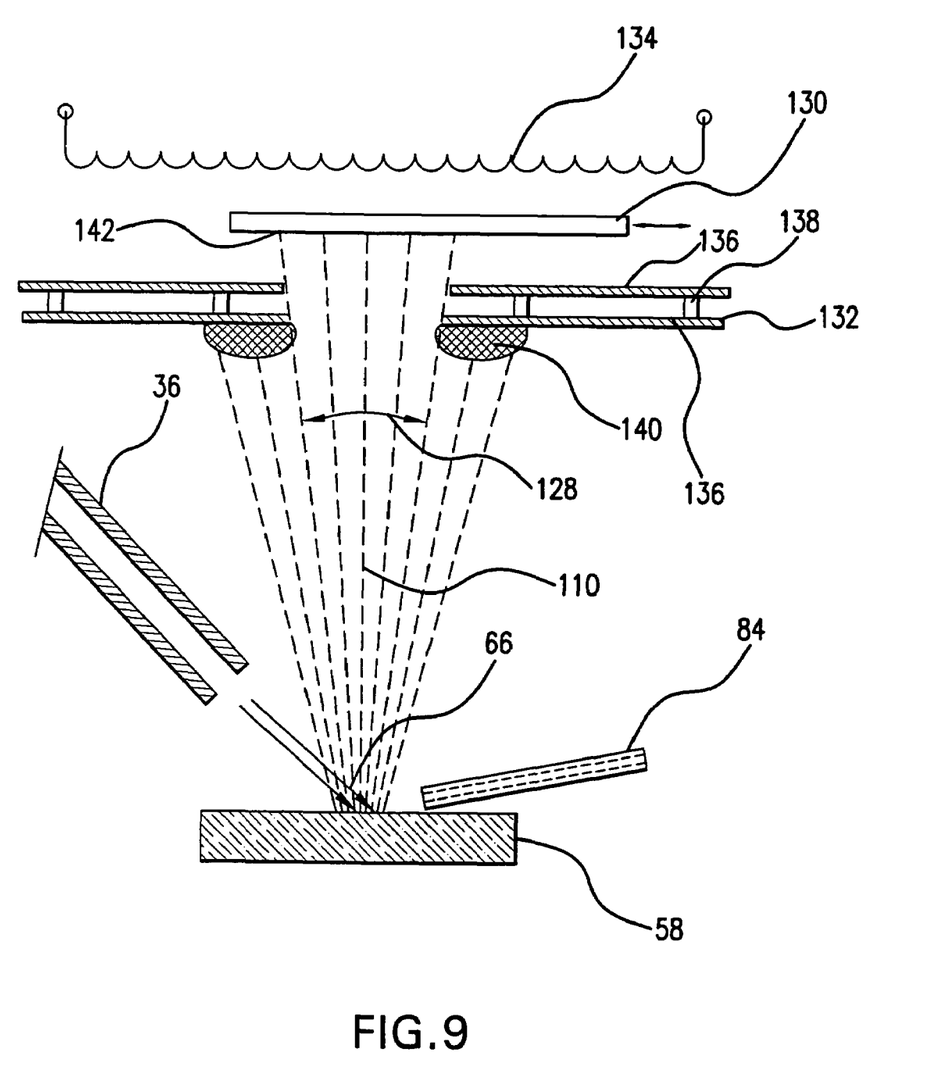
FIG. 9 represents schematically an arrangement of the present invention applied to a controlled thin film deposition utilizing an ablation stream aperture coupled to the ablation plasma generator of the present invention.
Figure 10:
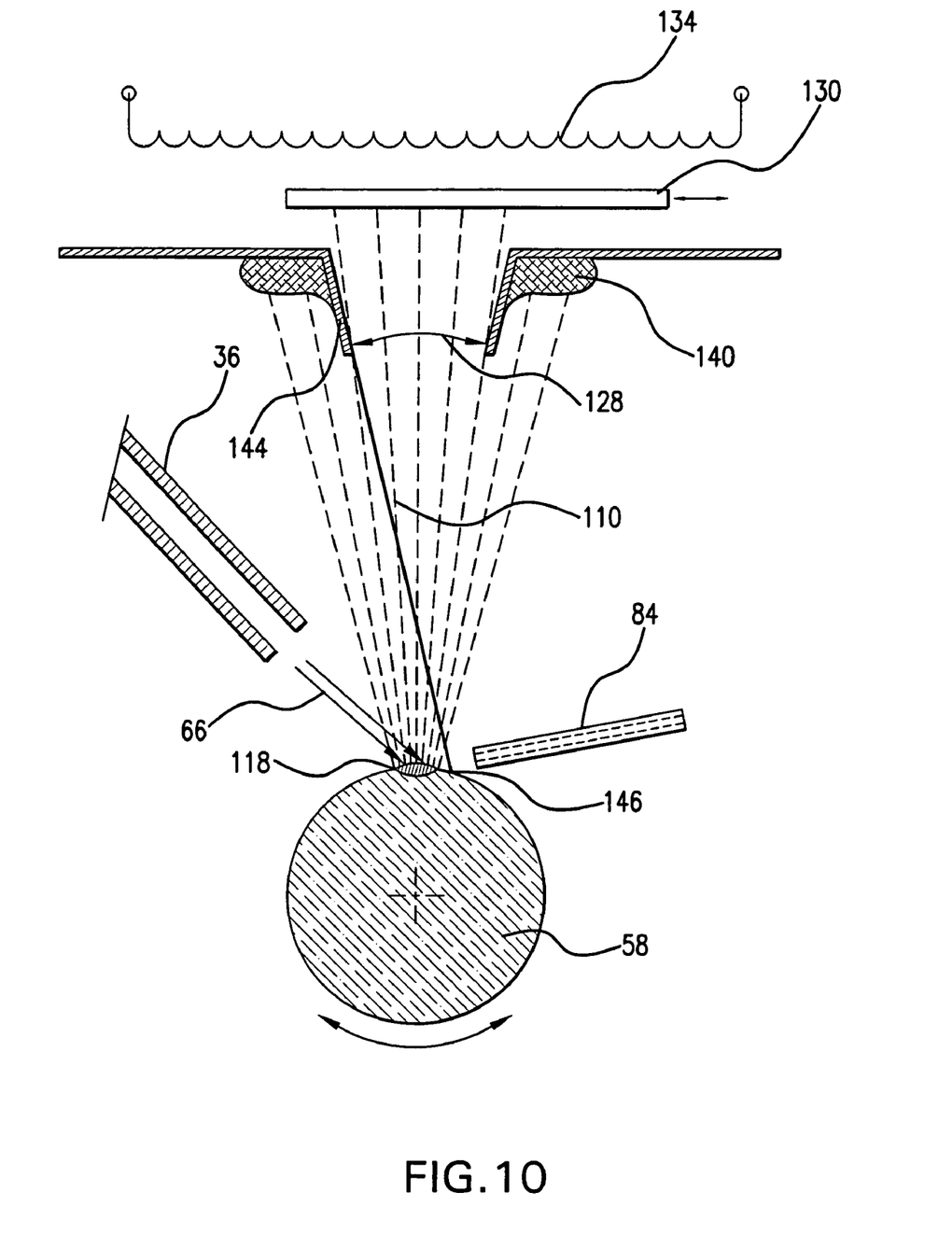
FIG. 10 is an alternative embodiment of the arrangement of FIG. 9, which avoids disturbance of the deposition material flow.

FIGS. 9 and 10 show mechanisms for shaping and controlling the plasma stream 110 material used in film formation. Stream 110 of ablated material is generally not uniform in its strength (amount of material carried), in its energy of the species, and in its elemental composition. On the axis of ablation stream, the plasma composition is closer to that of the target surface. Generally, only stream propagating within a solid angle 128 of about 30 degree carries the proper composition. If a portion of the substrate 130 used for film deposition occupies an area external of the angle undesirable changes in film composition occurs on this substrate portion.

In the apparatus of the present invention, an aperture 132 having an opening is used to control ablation stream and further to form a stream of target material species reaching the substrate 130 as shown in FIG. 9. The aperture intercepts the undesirable fraction of the ablation stream. The aperture may be of circular or elliptical contour, corresponding to the shape of the ablation stream.

Substrate heater 134 is positioned behind the substrate. However the aperture may be significantly heated and re-evaporation of material deposited on it may possibly contaminate the deposition stream. In order to reduce the heating of aperture it is formed by two or more aligned plates 136 isolated thermally by spacers 138 as shown in FIG. 9.

To obtain uniform thickness of film over substrate 130 over a larger area than the aperture, rotational, translational, or combination thereof a scanning of the substrate behind the aperture may be performed.

Some ablation stream species have a high kinetic energy of ~10 to 1000 eV. When bombarding the aperture surface, the species may sputter the aperture material. The sputtered species 140 propagate predominantly in a direction perpendicular to the aperture surface. However, some fraction of the sputtered material near the edge of the aperture opening enters the area of the opening. By intermixing with the incoming stream of target material, the sputtered material may be incorporated in the deposition stream and cause contamination of deposited material 142. To prevent contamination, an opening of a particular form contour 144 is used as is shown in FIG. 10. The opening edge has a cone-like shape. The cone edge is inclined at an angle of at least 30 degree relative to the plane of the aperture. Due to the cone angle, a majority of the sputtered species is directed away from the aperture opening. In this manner, sputtered material on the aperture edge does not interfere with the income ablation stream and the aperture introduces minimal disturbance into the stream propagation.

The cone geometry is selected so that the internal surface of the cone does not experience the incoming stream impact. This is accomplished by designing the target-to-aperture distance, the opening diameter, and the cone opening size in a manner that the extension of the cone side line intersects the target surface (point 146) external the ablation spot 118 and thus the inner surface of the cone "does not see" the spot, and consequently is not impacted by the ablation particles.

Figure 11:
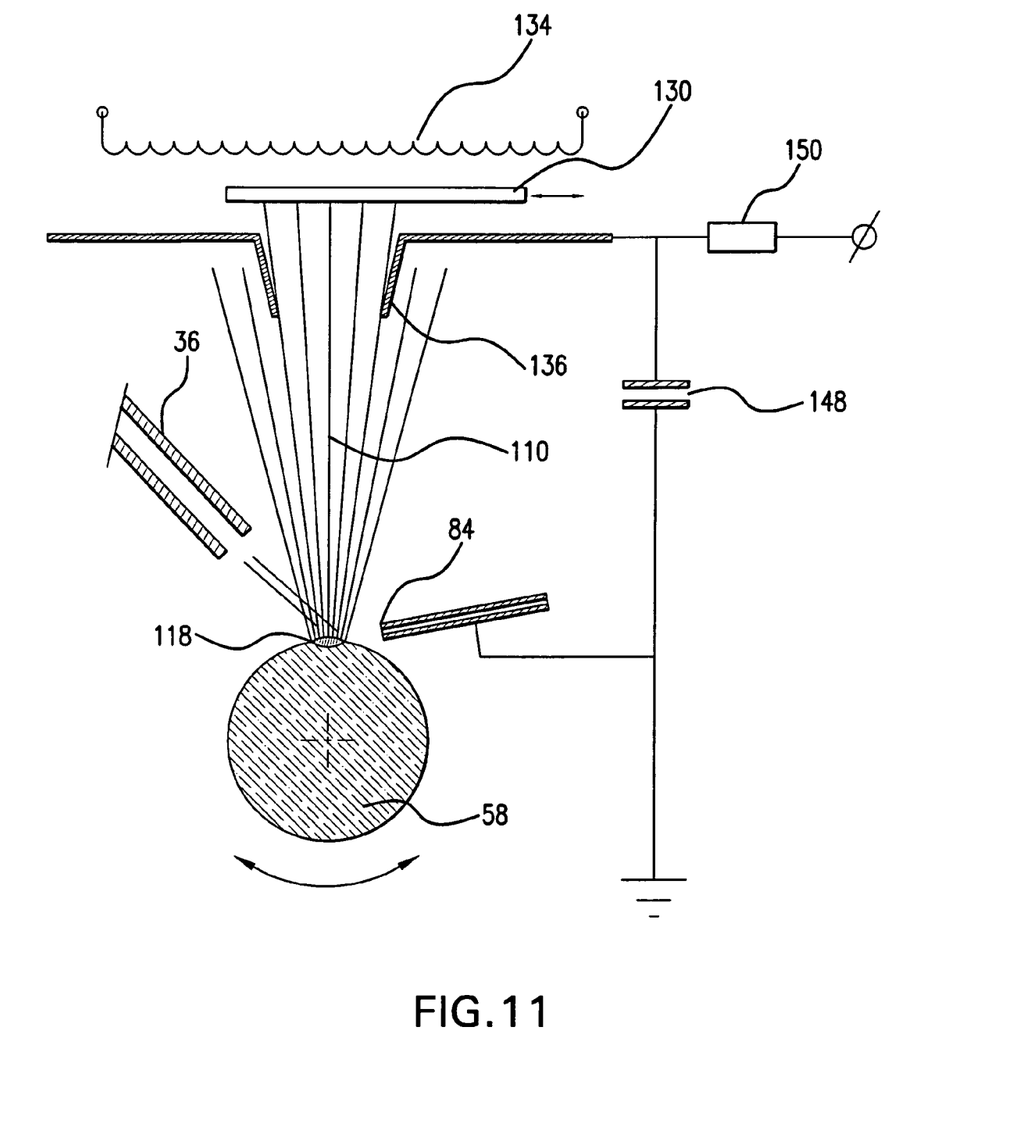
FIG. 11 schematically represents a principle of an additional excitation of deposition material species with self-synchronized discharge.

In FIG. 11, means to provide additional excitation of the deposition stream species is shown. For depositing thin films of some materials, it is beneficial to have the stream of atoms in an excited (ionized) state since they are generally more reactive than neutral atoms. The apparatus facilitates a convenient configuration for this excitation by providing a self-synchronized pulsed discharge through the ablation plume 110. The aperture 136 is initially biased at a voltage of 50-500 V by charging capacitor 148 via resistor 150. At a typical pressure of 1-10 mTorr, no glow discharge exists in the chamber. However, once ablation plasma is created in the space between the target and the aperture plate such serves as the discharge media, and capacitor discharge is triggered. This additional discharge excites species in the deposition stream. Value of the capacitor 150 is typically 0.01-1 µF. As the discharge plasma disappears, the discharge extinguishes and the capacitor becomes biased and the process repeats.

The effect of the gas gradient scheme of the present invention has been studied on the beam parameters by comparing amplitudes of the beam current pulse J, and the beam peak power W for conditions of conventional gas distribution (uniform pressure in vacuum chamber) as well as the gas gradient scheme. Typically, the gas gradient scheme provides a factor of about ~35% increase in the beam power. In addition, the amount of the target material ablated (as measured by thickness of a film deposited per one pulse) is a factor of approximately ~2 greater than a conventional technique. This indicates that both power and power density are enhanced in the gradient scheme.

Power density $w=W/S$ of the beam is the parameter that controls mostly the intensity of target-material ablation. W is the total beam power (expressed in Watts), and S is the beam cross-section on the target surface (expressed in cm2). The power $W=JV$ where J is the total beam current (in Ampers) and V is the potential (voltage gradient) by which the electrons are accelerated. Thus, the power density can be increased either via increasing the total beam current, or via increasing the voltage at the time the maximum current is generated or via decreasing the beam cross-section S.

For example, at an initial cathode voltage of 17 kV, the beam current amplitude increases from J~600 A in conventional scheme to J~700 A in the gas gradient scheme of the present invention which approximates a 15% increase. The beam peak power, however, increases ~35%. This indicates that the voltage V effectively accelerating the beam electrons in the gradient scheme is larger than that in conventional schemes. In other words, the dense "plasma anode", facilitated in the gradient scheme, extracts electrons from the "cathode plasma" more effectively than conventional schemes, at an earlier stage of the discharge prior to any significant decrease of the voltage. Typically, the effective voltage is ~½ of the initial voltage. Thus, the beam current is carried by electrons with energy ~17/2=8.5 keV each. The peak beam power is then W=700 A*8.5 keV ~6 MW. The power without the gas gradient scheme is ~4.5 MW.

The increase in the power density results in significant increase of materials deposition rate (rate the film thickness increases per one pulse). Even in the scheme with an isolated target (FIGS. 7A-7C), the rate increases about a factor of two in the gradient scheme in comparison with the conventional scheme. For example, the deposition rate of $Al_2O_3$ on a substrate located at a distance of 55 mm from target was found to increase from a conventional 0.05 nm/pulse to a 0.12 nm/pulse.

Of importance is the increase in deposition rate where the target is metallic and where the gas line is located directly on the beam axis. It has been found that the metal ablation (deposition) rate may be increased several (up to 10) times by using the gas gradient scheme. Some metal such as Al or Cu could not be ablated at all using conventional schemes. With the gradient scheme, due to the increased power density, these metals as well as Mg, Au, Ni, Ti, Ag and others have been successfully ablated and deposition rates ~0.02 nm/pulse have been attained even for the most difficult metals. The experiments with the scheme of FIG. 5A evidence that the presence of the dense anode plasma reduces the beam cross-section S. This leads to an additional increase in the beam power density, and contributes towards the large increase in the deposition rate of metals. The beam cross-section which is difficult to quantify, may be estimated from the size of the crater created by the beam on the surface of target. The size in the case of FIG. 5A is ~50% smaller than in conventional scheme. Thus, the presence of the anode plasma additionally changes the shape of the electron-emitting boundary between the cathode plasma and anode plasma which results in both a less divergent beam and a smaller beam cross section on target.

Although this invention has been described in connection with specific forms and embodiments thereof, it will be appreciated that various modifications other than those discussed above may be resorted to without departing from the spirit or scope of the invention as defined in the appended Claims. For example, equivalent elements may be substituted for those specifically shown and described, certain features may be used independently of other features, and in certain case, particular locations of elements may be reversed or interposed, all without departing from the spirit or scope of the invention as defined in the appended Claims.

What is claimed is:

1. A pulsed electron ablation (PEA) apparatus producing an ablation plasma emanating from a target subjected to an electron beam, comprising:
   a processing chamber;
   a source of an electron beam, the source of the electron beam including:
   a first plasma having a first front layer extending in said processing chamber and supplying electrons for generation of the electron beam; and
   a second plasma having a second front layer extending in said processing chamber in a counter relationship with said first front layer of said first plasma, a double contact layer being defined between said first and second front layers of said first and second plasmas, respectively, the power of the electron beam being increased as the result of an interaction of said first and second plasmas at said double contact layer; and
   a target positioned in said processing chamber a predetermined distance from said first front layer of said first plasma and exposed to the electron beam, the ablation plasma emanating from said target when the electron beam impinges thereupon.

2. The PEA apparatus of claim 1, further comprising an anode and a gas supply line coupled to said processing chamber to supply a process gas in a controlled fashion to said anode, thereby creating a pressure gradient between said anode and said first plasma, and stimulating an intense ionization of the process gas in said processing chamber in a vicinity of said anode, said second plasma being formed as the result of said ionization of said process gas in a vicinity of said anode under impact of said electron beam generated by said first plasma.

3. The PEA apparatus of claim 2, wherein said gas supply line includes a gas supply tube protected by an external cover tube from contaminating a stream of the ablation plasma.

4. The PEA apparatus of claim 2, wherein said target is selected from a group consisting of a cylinder shaped solid target, a tubularly shaped target, a rolled foil target, and a disk-shaped target.

5. The PEA apparatus of claim 2, wherein said source of the electron beam further comprises:
   a reservoir-shaped cathode positioned at a cathode side of said processing chamber, said reservoir-shaped cathode having walls enveloping an internal cavity defined therein,
   a tube having a channel extending therealong in fluid communication at one end of said tube with said internal cavity of said reservoir-shaped cathode, and extending at an opposite end of said tube into said processing chamber,
   a process gas filling said internal cavity of the said reservoir-shaped cathode, said channel of said tube, and said processing chamber, and
   a discharge trigger coupled to said reservoir-shaped cathode to initiate formation of initial plasma in said internal cavity, said initial plasma generating electrons propagating along said channel and ionizing said process gas therewithin, thereby forming said first plasma propagating along said channel towards an exit of said tube at said opposite end thereof, said first front layer of said first plasma being formed in a vicinity of said tube exit, said first front layer generating said electron beam.

6. The PEA apparatus of claim 5, wherein said anode includes an anode selected from the group consisting of a target, walls of said processing chamber, and said gas supply line.

7. The PEA apparatus of claim 6, wherein said target is positioned having a predetermined distance in the range 7-15 mm from said tube exit.

8. The PEA apparatus of claim 6, wherein said target has a hole of a predetermined size formed therethrough and wherein said gas supply line is coupled to said target in proximity to said hole, said second plasma originating in a vicinity of said hole.

9. The PEA apparatus of claim 6, wherein said target is formed of a material selected from a group consisting of a conductor, a semi-conductor, and an insulator.

10. The PEA apparatus of claim 5, further comprising an auxiliary electrode positioned at said tube exit to improve uniformity of said first plasma and to decrease the electron beam divergence, said auxiliary electrode having a cone-shaped opening having a predetermined cone angle.

11. The PEA apparatus of claim 10, further comprising a capacitor coupled to said auxiliary electrode to increase the electron beam intensity.

12. The PEA apparatus of claim 5, wherein said source of electron beams further comprises:
   an auxiliary anode arranged at said cathode side of said processing chamber in proximity to said reservoir-shaped cathode and electrically separated therefrom, and
   an electrical field applied between said reservoir-shaped cathode and said auxiliary anode, said electrical field facilitating propagation of said initial plasma from said internal cavity into said channel of said tube and therealong.

13. The PEA apparatus of claim 5, wherein said tube is positioned in an angled relationship with an ablation surface of said target.

14. The PEA apparatus of claim 5, wherein said target and said electron beam are displaceable relative each to the other in a controllable rotative or linear manner.

15. The PEA apparatus of claim 5, wherein the pressure of said process gas filling said internal cavity of said reservoir-shaped cathode, said channel of said tube, and said processing chamber is approximately in the range of 0.2-0.5 Pa, and wherein the pressure of said process gas in the vicinity of said first anode is approximately 80 Pa.

16. The PEA apparatus of claim 1 wherein the peak power of said electron beam increases more than 35% during a transient period of time once said first and second plasmas make contact at said double contact layer.

17. The PEA apparatus of claim 1, further comprising an aperture member positioned in a crossing relationship with the ablation plasma emanating from said target to prevent predetermined portions of said ablation plasma from being delivered to a substrate for deposition thereon.

18. The PEA apparatus of claim 17, wherein said aperture member includes an opening formed therein, a periphery of said opening defining a cone shaped wall to select a desired portion of said ablation plasma to be delivered to the substrate.

19. The PEA apparatus of claim 17, further comprising an excitation unit coupled to said ablation plasma, said excitation unit supplying self-synchronized pulsed discharge to said ablation plasma.

20. A pulsed electron ablation (PEA) apparatus utilizing an electron beam having an increased beam power density, comprising:
  a processing chamber;
  a source of an electron beam positioned in said processing chamber, said source of the electron beam including:
  a cathode plasma having a cathode plasma front layer extending in said processing chamber and generating the electron beam;
  an anode positioned in said processing chamber a predetermined distance from said cathode plasma front layer of said cathode plasma and exposed to the electron beam;
  an anode plasma formed at said anode and having an anode plasma front layer extending in said processing chamber in a counter relationship with said cathode plasma front layer of said cathode plasma whereby a double space charge contact layer is defined between said cathode and anode plasma front layers; and
  a gas supply line coupled to said processing chamber to supply the process gas in a controlled manner to said anode, thereby creating a pressure gradient of said process gas in said processing chamber between said anode and said cathode plasma and stimulating an intense ionization of said process gas in the vicinity of said anode;
  wherein said anode plasma is formed as the result of the ionization of the process gas delivered to the vicinity of said anode under the impact of said electron beam generated by said cathode plasma, and wherein the power of said electron beam is increased as the result of an interaction between said cathode and anode plasmas at said double contact layer.

* * * * *